United States Patent
Lam (10) Patent No.: US 10,553,524 B2
(45) Date of Patent: Feb. 4, 2020

(54) INTEGRATED CIRCUIT (IC) DIE ATTACHED BETWEEN AN OFFSET LEAD FRAME DIE-ATTACH PAD AND A DISCRETE DIE-ATTACH PAD

(71) Applicant: Microchip Technology Incorporated, Chandler, AZ (US)

(72) Inventor: Man Kit Lam, Colorado Springs, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/058,729

(22) Filed: Aug. 8, 2018

(65) Prior Publication Data
US 2019/0131216 A1   May 2, 2019

Related U.S. Application Data

(60) Provisional application No. 62/578,630, filed on Oct. 30, 2017.

(51) Int. Cl.
*H01L 23/495* (2006.01)
*H01L 23/00* (2006.01)
(Continued)

(52) U.S. Cl.
CPC .... *H01L 23/49524* (2013.01); *H01L 21/4825* (2013.01); *H01L 23/4334* (2013.01);
(Continued)

(58) Field of Classification Search
CPC ......... H01L 24/32; H01L 24/38; H01L 24/83; H01L 23/31; H01L 23/31; H01L 23/3107;
(Continued)

(56) References Cited

U.S. PATENT DOCUMENTS

| 7,557,432 B2 * | 7/2009 | Tang ................. H01L 23/3107 257/666 |
| 2009/0230518 A1 | 9/2009 | Liu et al. ..................... 257/666 |

(Continued)

FOREIGN PATENT DOCUMENTS

EP    0962975 A2    12/1999  ............. H01L 23/48

OTHER PUBLICATIONS

Fu, Xiao et al., "A Cool Packaging Technology for Power Conversion Application," IEEE International Conference on Computer Science and Automation Engineering, pp. 293-296, Jun. 10, 2011.
(Continued)

*Primary Examiner* — Monica D Harrison
(74) *Attorney, Agent, or Firm* — Slayden Grubert Beard PLLC (57) ABSTRACT

An integrated circuit (IC) package, e.g., a power MOSFET package, may include a lead frame including (a) a main lead frame structure including a plurality of leads and defining or lying in a main lead frame plane, and (b) an offset lead frame die-attach pad (DAP) defining or lying in an offset plane that is offset from the main lead frame plane. The power IC package may further include a semiconductor die having a first side attached to the offset lead frame DAP, and a conductive element attached to both (a) a second side of the semiconductor die and (b) the main lead frame structure. The lead frame including the offset DAP may emulate the functionality of a copper clip, thus eliminating the need for the copper clip. The power IC package may also exhibit enhanced heat dissipation capabilities.

20 Claims, 10 Drawing Sheets

(51) Int. Cl.
*H01L 23/433* (2006.01)
*H01L 21/48* (2006.01)
*H01L 23/31* (2006.01)
*H01L 21/56* (2006.01)
*H02M 7/00* (2006.01)

(52) U.S. Cl.
CPC .... *H01L 23/4951* (2013.01); *H01L 23/49513* (2013.01); *H01L 23/49537* (2013.01); *H01L 23/49541* (2013.01); *H01L 23/49551* (2013.01); *H01L 23/49562* (2013.01); *H01L 23/49568* (2013.01); *H01L 23/49575* (2013.01); *H01L 23/49579* (2013.01); *H01L 24/38* (2013.01); *H01L 24/40* (2013.01); *H01L 24/77* (2013.01); *H01L 24/83* (2013.01); *H01L 24/84* (2013.01); *H01L 21/561* (2013.01); *H01L 21/568* (2013.01); *H01L 23/3107* (2013.01); *H01L 24/06* (2013.01); *H01L 24/32* (2013.01); *H01L 24/48* (2013.01); *H01L 24/49* (2013.01); *H01L 2224/05554* (2013.01); *H01L 2224/0603* (2013.01); *H01L 2224/06164* (2013.01); *H01L 2224/32245* (2013.01); *H01L 2224/37147* (2013.01); *H01L 2224/48137* (2013.01); *H01L 2224/49112* (2013.01); *H01L 2224/49171* (2013.01); *H01L 2224/49175* (2013.01); *H01L 2224/49431* (2013.01); *H01L 2224/49433* (2013.01); *H01L 2224/77701* (2013.01); *H01L 2224/77755* (2013.01); *H01L 2224/83005* (2013.01); *H01L 2224/83136* (2013.01); *H01L 2224/84136* (2013.01); *H01L 2924/00014* (2013.01); *H01L 2924/13091* (2013.01); *H01L 2924/14* (2013.01); *H01L 2924/181* (2013.01); *H02M 7/003* (2013.01)

(58) Field of Classification Search
CPC ... H01L 23/49; H01L 23/495; H01L 23/4951; H01L 23/4952; H01L 23/49524; H01L 23/49541; H01L 23/49551; H01L 23/49562; H01L 23/49568; H01L 23/49575; H01L 23/49579; H01L 21/48; H01L 21/482; H01L 21/4825; H01L 24/40; H01L 24/77; H01L 24/84; H01L 23/43; H01L 23/433; H01L 23/4334; H01L 23/48; H01L 23/482; H01L 23/4285; H01L 23/49513; H01L 23/49537; H01L 23/4955; H01L 23/4956; H01L 21/56; H01L 21/561; H01L 21/568
USPC .......................................................... 257/675
See application file for complete search history.

(56) References Cited

U.S. PATENT DOCUMENTS

2010/0252918 A1* 10/2010 Jiang ................... H01L 21/4842
   257/675
2011/0298114 A1   12/2011 Pruitt ........................... 257/676

OTHER PUBLICATIONS

Fu, Xiao et al., "Advanced VRM Incorporated with 3D DCB Package for Computer Power Management Applications," IEEE 14th International Conference on High Performance Computing and Communications, pp. 1118-1124, Jun. 25, 2012.
International Search Report and Written Opinion, Application No. PCT/US2018/057930, 19 pages, dated Feb. 4, 2019.

* cited by examiner

INTEGRATED CIRCUIT (IC) DIE ATTACHED BETWEEN AN OFFSET LEAD FRAME DIE-ATTACH PAD AND A DISCRETE DIE-ATTACH PAD

RELATED PATENT APPLICATION

This application claims priority to commonly owned U.S. Provisional Patent Application No. 62/578,630 filed Oct. 30, 2017, the entire contents of which are hereby incorporated by reference for all purposes.

TECHNICAL FIELD

The present disclosure relates to semiconductor packages and packaging, e.g., an integrated circuit (IC) package (e.g., Power MOSFET package) having a semiconductor die (e.g., MOSFET die) attached between a offset lead frame die-attach pad and a discrete thick die-attach pad, e.g., a discrete metal heat slug.

BACKGROUND

Integrated circuits (ICs) are typical formed in protective packages for handling and assembly onto printed circuit boards and to protect the devices from damage. A very large number of different types of package exist. IC packages that contain devices designed to handle significant power levels, e.g., power MOSFET devices, may be referred to as high-power IC packages or simply power IC packages.

In typical power IC packages, e.g., MOSFET devices, in order to improve device performance, high current may need to be applied to the device to help lower the RDS(on) (Drain-Source on resistance). One technique to address this is to apply multiple wire bonds to connect the source to the package lead frame. However, the wire resistance and contact resistances limit the effectiveness of such design. Another technique is solder attach a discrete copper clip onto the package lead frame to connect it to the MOSFET Source terminal. However, this solution adds cost.

Figure 1:
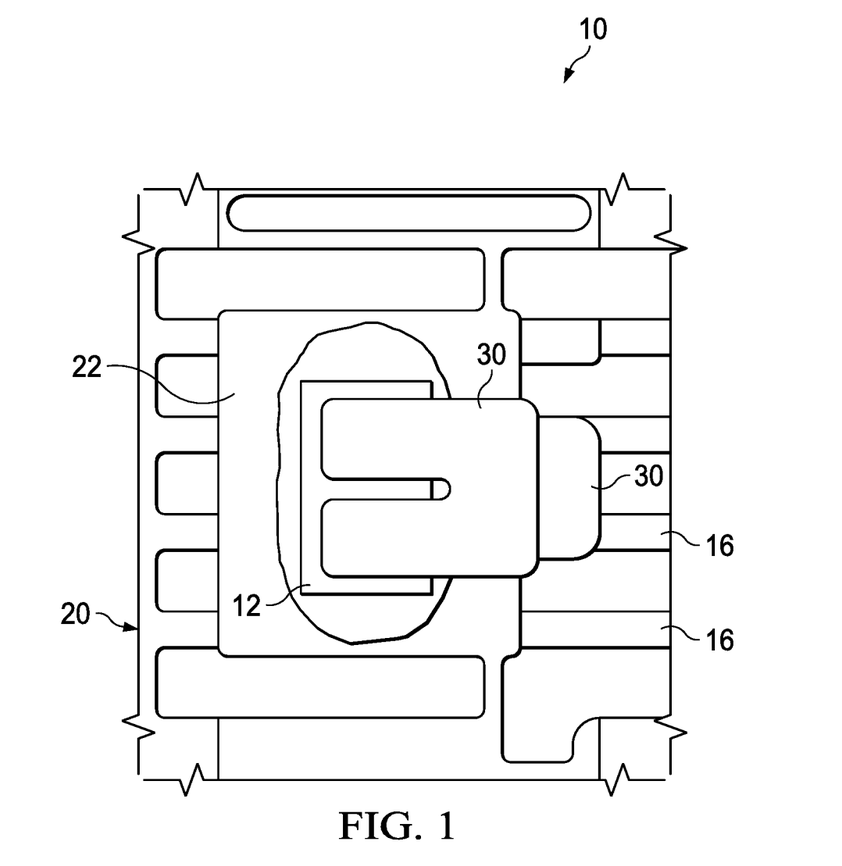
FIG. 1 illustrates an example conventional power MOSFET package.

Another common technique is to solder attach a discrete copper clip to the source pad of the die and solder the other end to the package lead frame pad. FIG. 1 shows an example structure formed according to this conventional technique. In particular, FIG. 1 is a top view of an example conventional MOSFET DFN (dual-flat no-leads) MOSFET package 10 during fabrication. Package 10 includes a lead frame 12 including a die-attach pad (DAP) 14 and a plurality of lead fingers 16 extending from the DAP 14. A MOSFET die 20 is mounted to the DAP 14, e.g., by epoxy, and secured using a copper clip 30, which may be solder attached to the lead frame 12. However, the copper clip 30 and the associated assembly steps typically add significant cost to the package, and may require an investment in custom automated assembly equipment.

Another common issue in power IC packages is thermal management, e.g., due to the high operational currents. In the conventional techniques discussed above, the power device (e.g., power MOSFET) is typically solder attached onto the die-attach paddle (DAP) of the package lead frame. The heat dissipation capacity through the DAP is typically limited by the material properties and thickness of the lead frame.

SUMMARY

Embodiments of the present invention may integrate the copper clip function into the lead frame design, and may thus provide one or more of the following advantages: (a) eliminating the discrete copper clip component cost and part of the associated assembly costs (plus yield loss and cycle time), (b) eliminating the capital investment cost for auto assembly equipment, and/or (c) enhancing the heat dissipation capability of the package.

Some embodiments of the present invention may convert the die-attach paddle (DAP) of the package lead frame into the source lead (using lead-forming technique) and solder-attach the DAP to the MOSFET source pad. For example, some embodiments modify the conventional DAP design and use a forming technique to bend the DAP out of the main lead frame plane (e.g., upwards) to emulate a Cu clip. This may eliminate the contact resistance between a discrete Cu clip soldered onto the package leads. In addition, the part and assembly costs of installing a discrete Cu clip may be eliminated.

As the DAP area may be "empty" or "vacant," in some embodiments a heat slug of relatively high thermal conductively and thickness (as compared with the original lead frame material), for example a relatively thick metal slug, may be attached (e.g., soldered) to the package lead frame as a drain connection, which may increase the thermal dissipation capacity of the DAP, as compared with conventional designs.

In general, one of ordinary skill in the art would not think to eliminate the DAP for various reasons, including the fact that the DAP is critical for die-attach, and because manufacturers in the industry typically have installed Cu clip machines for their products.

One embodiment provides an IC package, e.g., a power MOSFET package, including a lead frame including (a) a main lead frame structure including a plurality of leads and defining or lying in a main lead frame plane, and (b) an offset lead frame DAP defining or lying in an offset plane offset from the main lead frame plane. The power IC package may further include a semiconductor die having a first side attached to the offset lead frame DAP, and a conductive element, e.g., a copper or other metal heat slug, attached to both (a) a second side of the semiconductor die and (b) the main lead frame structure.

In one embodiment, the conductive element is at least partially located in an area between the main lead frame plane and the offset plane.

In one embodiment, a surface of the conductive element is co-planar with the main lead frame structure.

In one embodiment, the conductive element is thicker than (e.g., 1-5X or at least 2x) the main lead frame structure, in a direction perpendicular to the main lead frame plane.

In one embodiment, the conductive element is at least twice as thick as the main lead frame structure, in a direction perpendicular to the main lead frame plane.

In one embodiment, the offset lead frame DAP defines a source lead for the semiconductor die, and the conductive element defines a drain lead for the semiconductor die.

In one embodiment, the IC package comprises a power MOSFET package and the semiconductor die comprises a MOSFET die.

In one embodiment, the main lead frame structure further includes at least one additional die-attach-pad, lying in the main lead frame plane, for receiving at least one additional semiconductor die or device. For example, in one embodiment, the lead frame further includes a microcontroller die-attach-pad (DAP), and the IC package includes a microcontroller mounted to the microcontroller DAP. The microcontroller DAP may form a portion of the main lead frame structure, lying in the main lead frame plane.

Another embodiment provides a method of forming an integrated circuit (IC) package, the method comprising providing a lead frame including a lead frame including (a) a main lead frame structure including a plurality of leads and lying in a main lead frame plan, and (b) an offset lead frame die-attach pad (DAP) lying in an offset plane that is offset from the main lead frame plane; attaching a first side of a semiconductor die to the offset lead frame DAP; attaching a conductive element, e.g., a copper or other metal heat slug, to a second side of the semiconductor die; and attaching the conductive element to the main lead frame structure.

In one embodiment, the conductive element is attached to the second side of the semiconductor die and to the main lead frame structure in a common step.

In one embodiment, the method includes forming the lead frame by bending or otherwise reshaping the lead frame such that the offset lead frame DAP is located in the offset plane.

In one embodiment, the method further includes mounting at least one additional semiconductor device (e.g., a microcontroller) on the at least one additional die-attach-pad, which may form part of the main lead frame structure laying in the main lead frame plane.

Another embodiment provides a lead frame for an integrated circuit (IC) device, comprising a main lead frame structure including a plurality of leads, the main lead frame structure lying in a main lead frame plane, and an offset lead frame die-attach pad (DAP) for mounting a semiconductor die, the offset lead frame DAP lying in an offset plane that is offset from the main lead frame plane

BRIEF DESCRIPTION OF THE DRAWINGS

Example aspects of the present disclosure are described below in conjunction with the figures, in which.

DETAILED DESCRIPTION

Figure 2A:
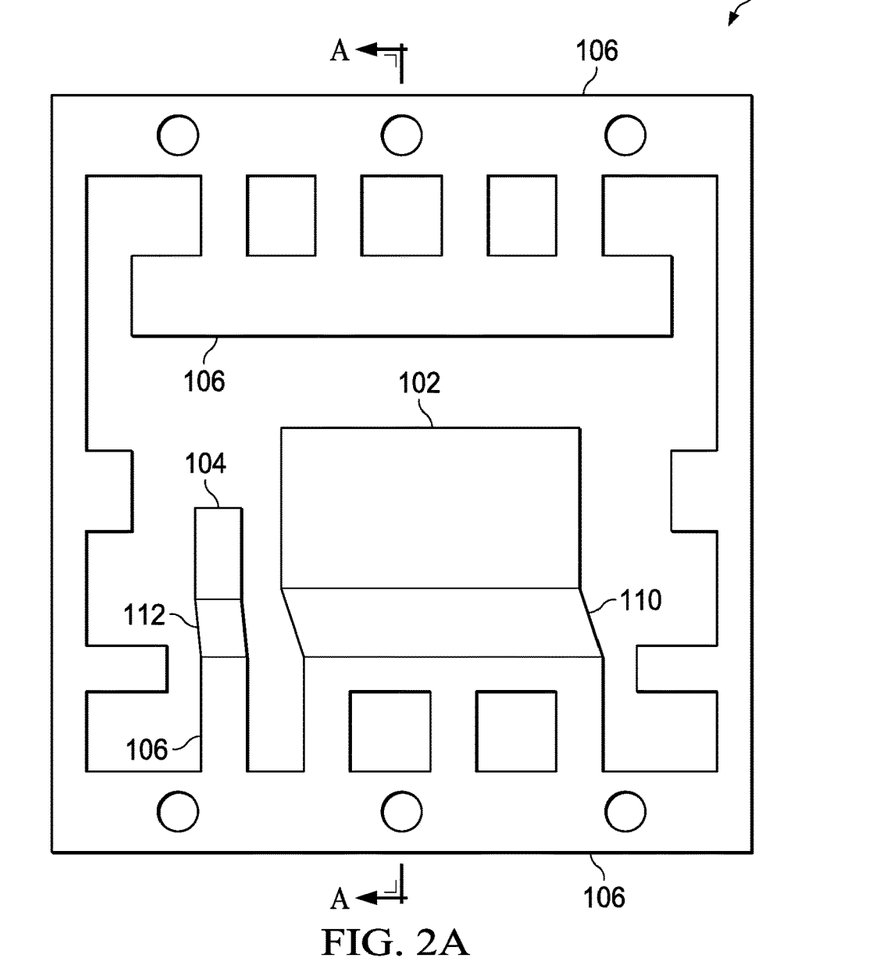
FIGS. 2A-2B, 3A-3B, 4-6, 7A-7B, and 8-10 illustrate an example process of forming a power IC package, e.g., a power MOSFET, according to one embodiment of the invention.
Figure 2B:
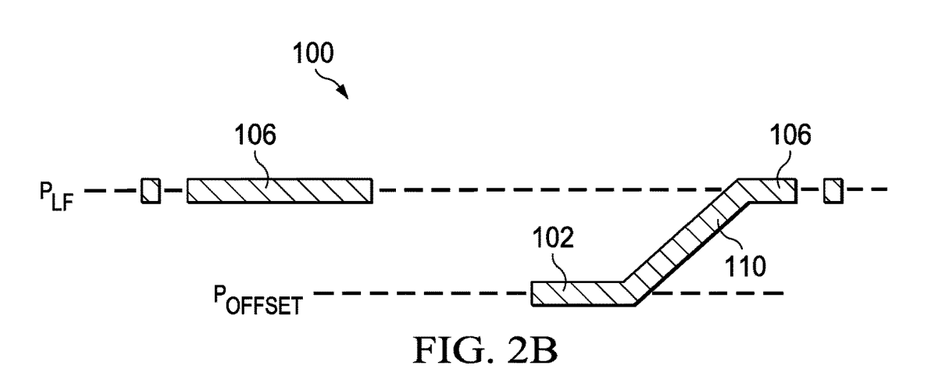

FIGS. 2A-2B, 3A-3B, 4-6, 7A-7B, and 8-10 illustrate an example process for forming a power IC package, e.g., for a power MOSFET, according to one embodiment of the invention. FIGS. 2A and 2B show a first step, in which selected portions of a lead frame 100, for example a lead frame DAP 102 and/or gate signal lead 104, are bent or otherwise formed out of plane (e.g., upwards or downwards) with respect to the main structure 106 of lead frame 100, either during or after manufacturing of the lead frame 100.

FIG. 2A shows a top (or bottom) view of lead frame 100, and FIG. 2B shows a cross sectional view through cut line A-A shown in FIG. 2A.

Figure 12A:
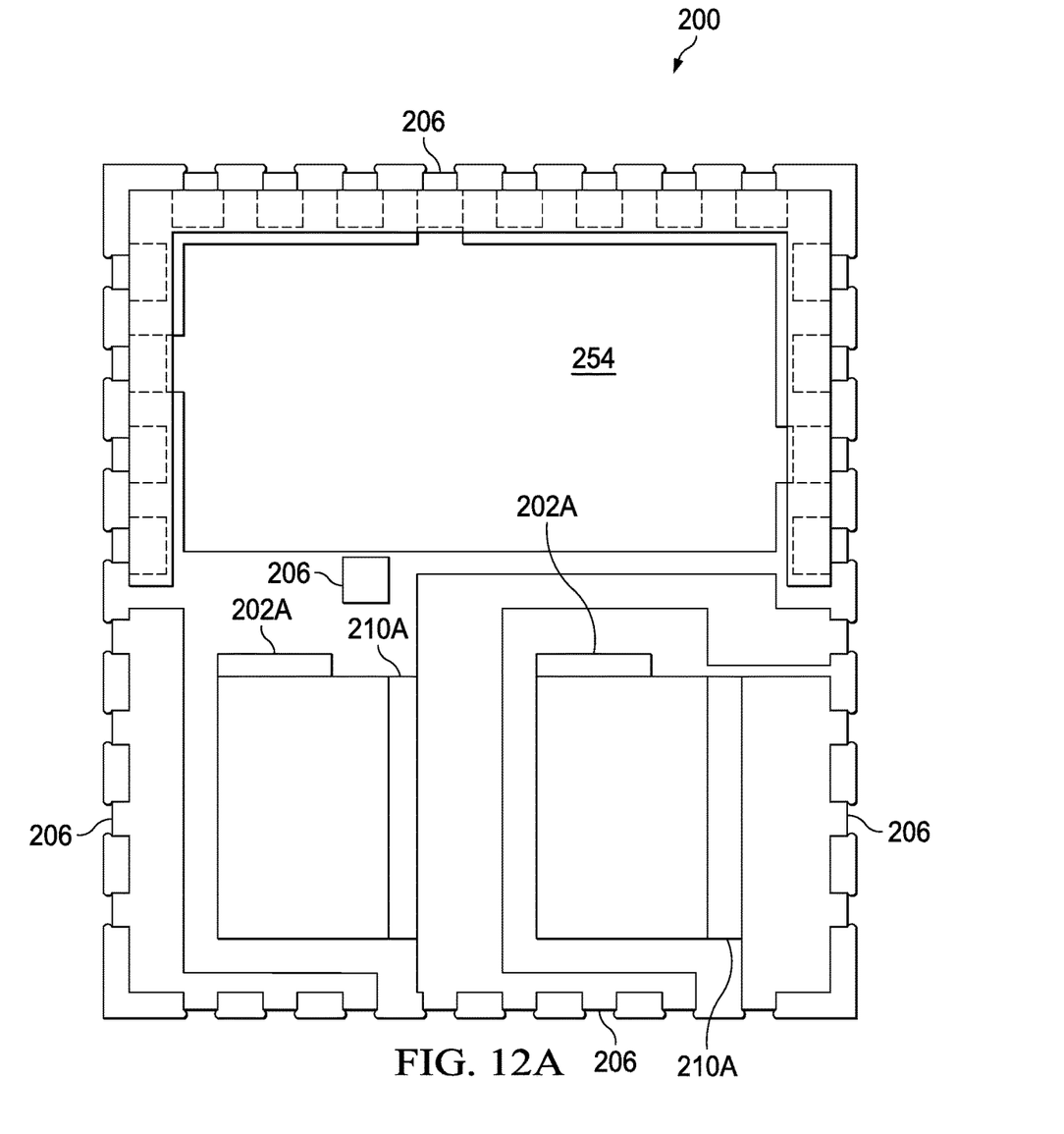
FIG. 12A shows a top view of an example lead frame for a dual-MOSFET package according to one example embodiment of the present invention.
Figure 12B:
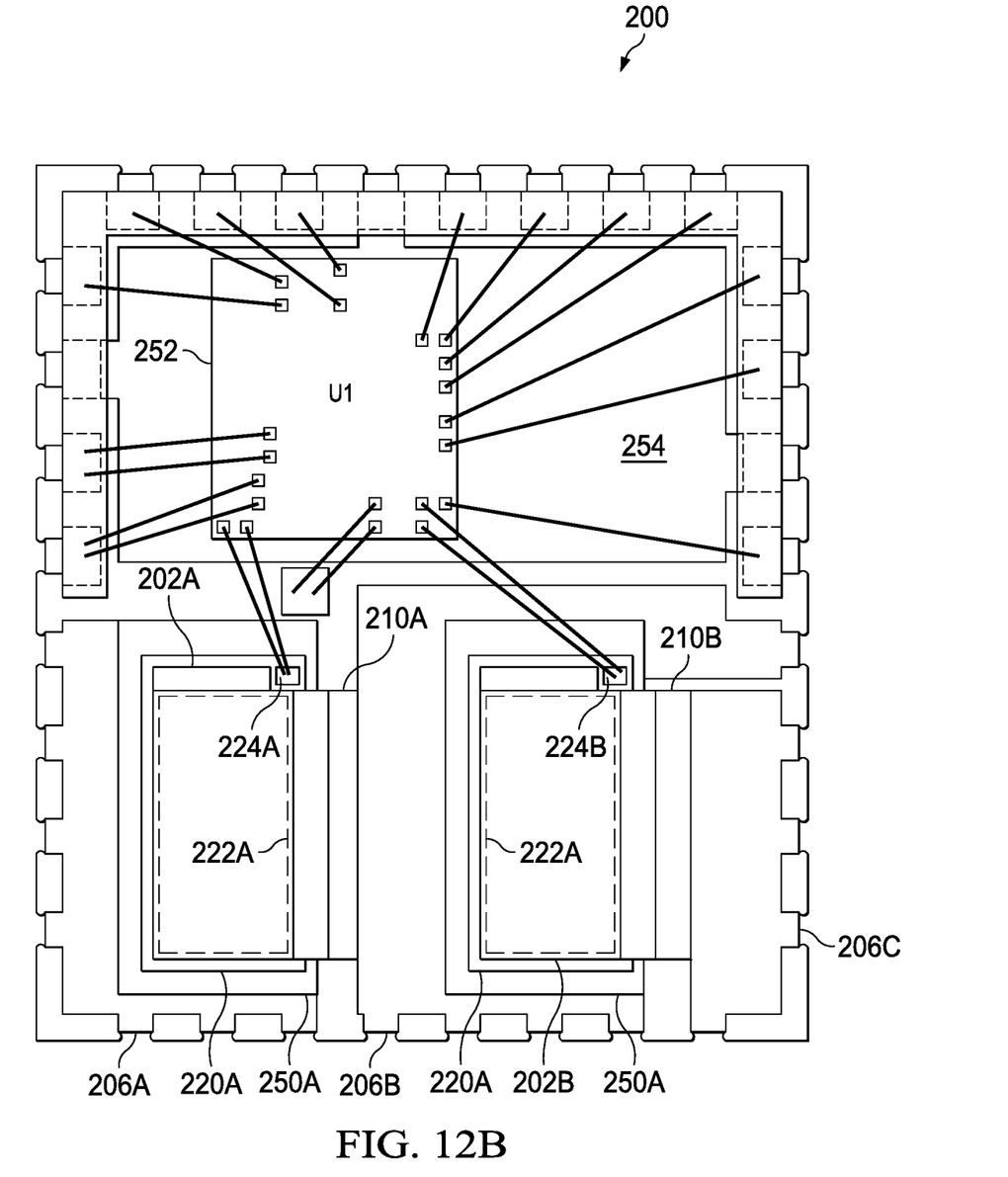
FIG. 12B shows a top view of the example lead frame of FIG. 12A, after solder attachment of a pair of MOSFETs and conductive elements or "thick DAP" structures (e.g., metal slugs), e.g., according to one example embodiment of the invention.

The main lead frame structure 106 may include a plurality of leads and/or other structures. In some embodiments, the main lead frame structure 106 may include one or more additional die-attach-pads (e.g., as shown in FIGS. 12A-12B discussed below). The main structure 106 of lead frame 100 may define or lie in a main lead frame plane $P_{LF}$, whereas DAP 102 and/or gate signal lead 104 are bent or otherwise formed out of plane with the main lead frame plane $P_{LF}$. The main lead frame structure 106 may comprise any fractional percentage (e.g., more or less than 50%) of the overall size or footprint of lead frame 100.

In the example embodiment shown in FIG. 2B, DAP 102 defines or lies in an offset plane $P_{offset}$ parallel to the main lead frame plane $P_{LF}$. In other embodiments, offset plane $P_{offset}$ may be offset from, but non-parallel to, main lead frame plane $P_{LF}$. In the illustrated example embodiments, gate signal lead 104 also lies in the offset plane $P_{offset}$. In other embodiments, gate signal lead 104 may define or lie in a different offset plan, e.g., to match the three-dimensional structure of the MOSFET die to be mounted to DAP 102 and gate signal lead 104.

DAP 102 and gate signal lead 104 may be connected with portion(s) of the main lead frame structure 106 via transition or coupling regions 110 and 112, respectively, which may extend perpendicular with main lead frame plane $P_{LF}$ and/or offset plane $P_{offset}$, or at a non-parallel, non-perpendicular angle relative to main lead frame plane $P_{LF}$ and/or offset plane $P_{offset}$. For example, in the example shown in FIG. 2B, transition region 110 extends at an approximately 45 degree angle relative to main lead frame plane $P_{LF}$. DAP 102 and gate signal lead 104 may be co-planar with each other or may lie in offset planes offset from each other, e.g., based on the three-dimensional structure of the MOSFET die to be mounted to DAP 102 and gate signal lead 104.

DAP 102 and gate signal lead 104 are bent or otherwise formed out of plane with plane $P_{LF}$ in any suitable manner and using any suitable manufacturing systems, devices, or processes. For example, any suitable lead forming jig or tool, e.g., a pneumatic or manual tool, may be used to stamp, press, or bend lead frame 100 into the shape shown in FIGS. 2A and 2B.

Figure 3A:
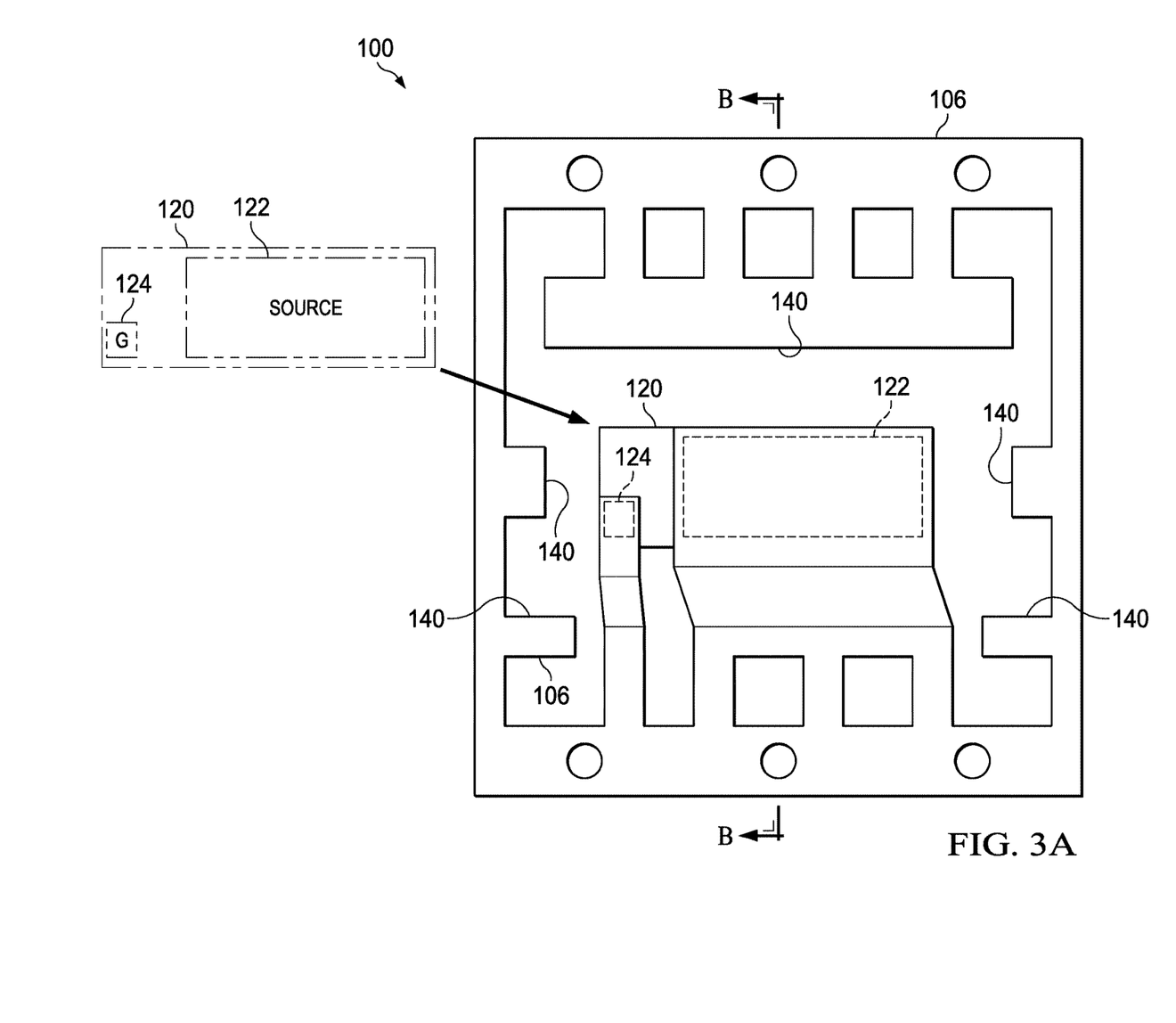
Figure 3B:
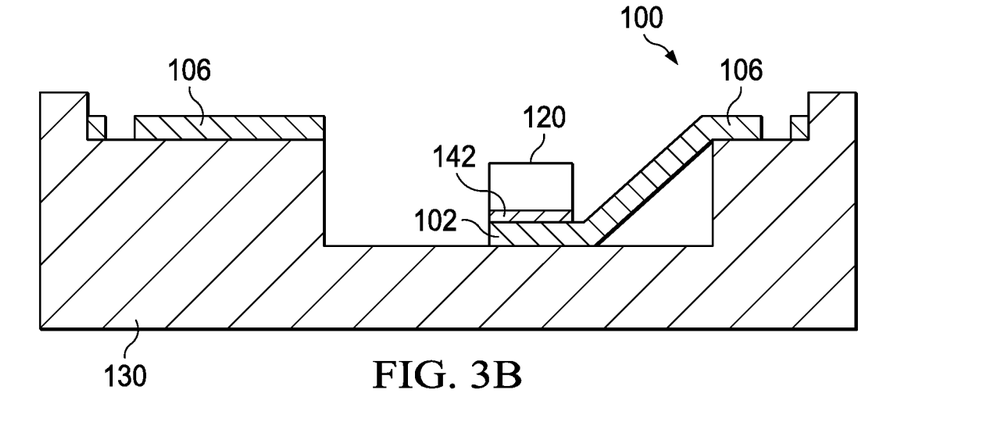

As shown in FIG. 3A (top view) and FIG. 3B (cross section through line B-B shown in FIG. 3A), lead frame 100 may be arranged in a jig 130, and a MOSFET die 120 may be attached to the bent portions of the lead frame 100. For example, a source contact region 122 may be attached (e.g., via soldering or wire bonding) to the lead frame DAP 102, and a gate contact region 124 may be attached (e.g., via soldering or wire bonding) to the gate signal lead 104. Example solder material is indicated in FIG. 3B at 142.

As discussed below, an electrically and thermally conductive element 150, referred to herein as a "thick DAP" or "heat slug," may then be mounted to the free side of MOSFET die 120 (i.e., opposite the side attached to DAP 102). In some embodiments, conductive element 150 may comprise a metal heat slug, e.g., comprising copper. Conductive element 150 (e.g., metal heat slug) 150 may have any suitable thickness, e.g., greater than the lead frame material thickness, or about 2 times the lead frame thickness (e.g., 1.5×-2.5× the lead frame thickness), or at least 2 times the lead frame thickness, or 1-5 times the lead frame thickness, for example.

As shown in FIG. 3A, lead frame 100 may include guide or registration features 140 shaped and/or located to facilitate the physical alignment and/or guidance of the conductive element 150 (e.g., metal heat slug) during mounting to the MOSFET die 120. Thus, in some embodiments, the lead frame structure may provide a built-in guide for a "floating" alignment of the conductive element.

Figure 4:
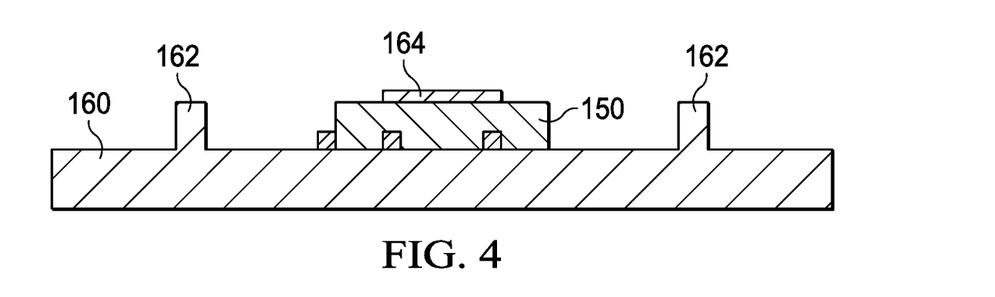

As shown in the cross-sectional side view of FIG. 4, a conductive element or "thick DAP" 150 (e.g., a metal heat slug) may be mounted on a jig 160, which may include alignment or guidance structures 162, e.g., tooling pins. Solder paste 164 may be dispensed on the conductive element 150.

Figure 5:
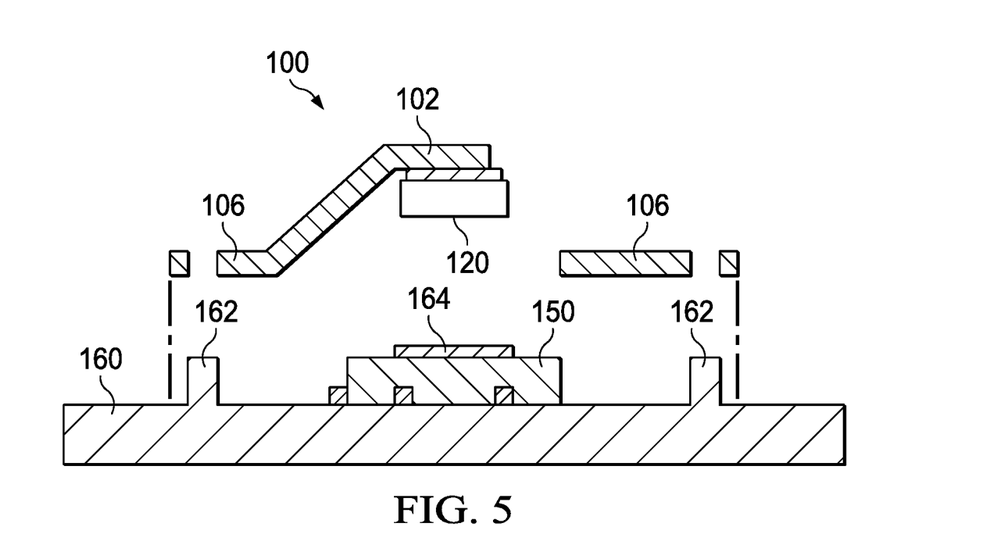

As shown in FIG. 5, the lead frame 100 with attached MOSFET 120 may be arranged onto the conductive element 150 via the alignment or guidance structures 162, e.g., via tooling pin guidance.

Figure 6:
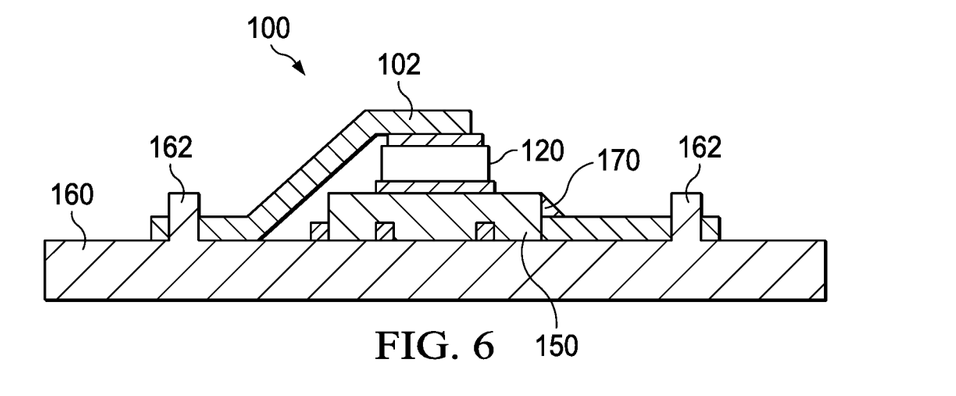

As shown in FIG. 6, a reflow solder attach process may be performed, e.g., at locations indicated at 170. The conductive element 150 may be received into the lead frame DAP area due to the forming/bending of the lead frame DAP 102 out of plane with the main lead frame structure 106.

Figure 7A:
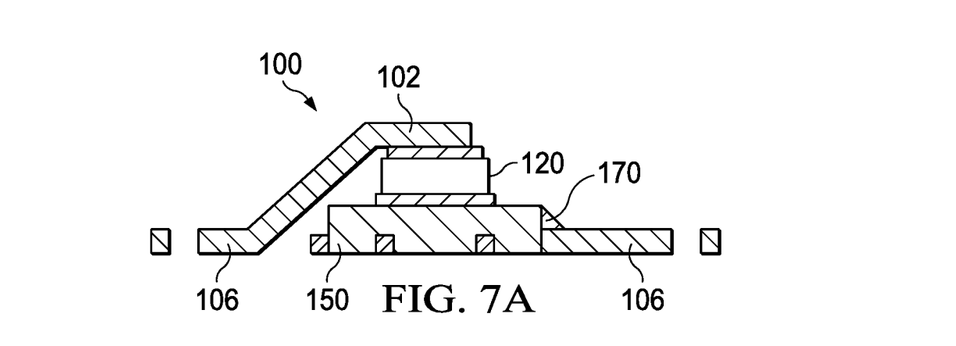
Figure 7B:
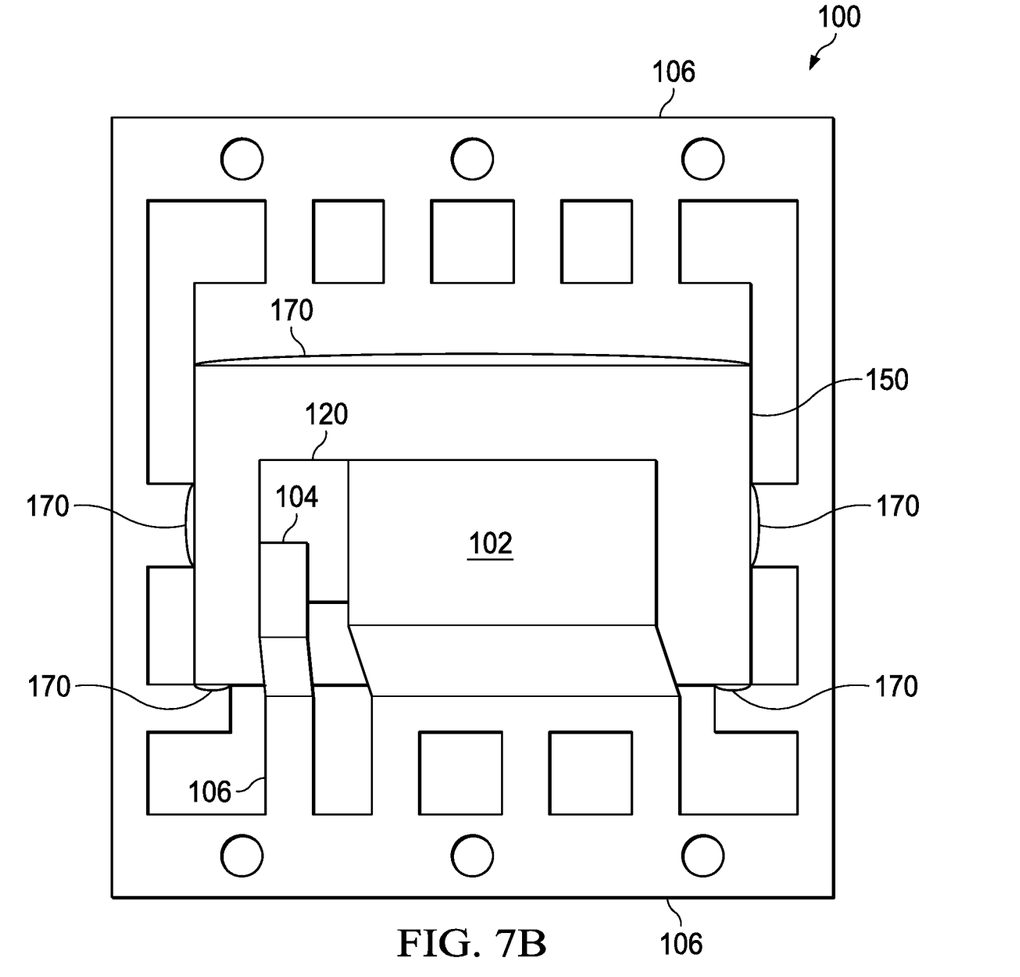

As shown in FIG. 7A, the lead frame 100 with MOSFET 120 and conductive element 150 attached may then be removed from the jig 160. FIG. 7B is a top view of the structure shown in FIG. 7A, showing the MOSFET 120 and conductive element 150 attached to lead frame 100.

Figure 8:
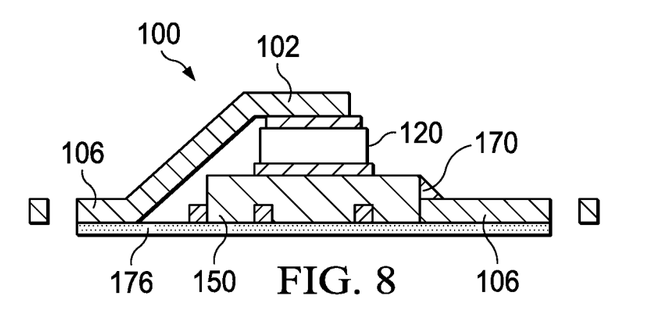

As shown in FIG. 8, a lead frame taping 176 may be applied to the back side of the conductive element 150 and co-planar portions of lead frame 100.

Figure 9:
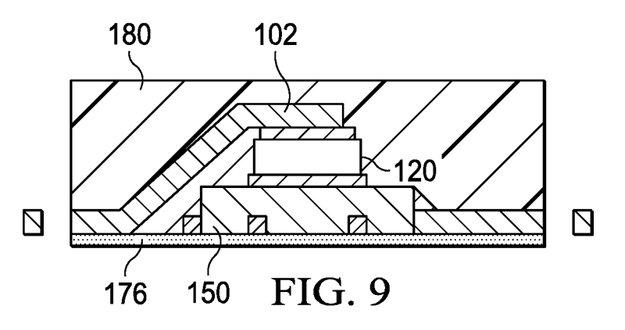

As shown in FIG. 9, a mold compound 180 may be applied to encase the MOSFET package.

Figure 10:
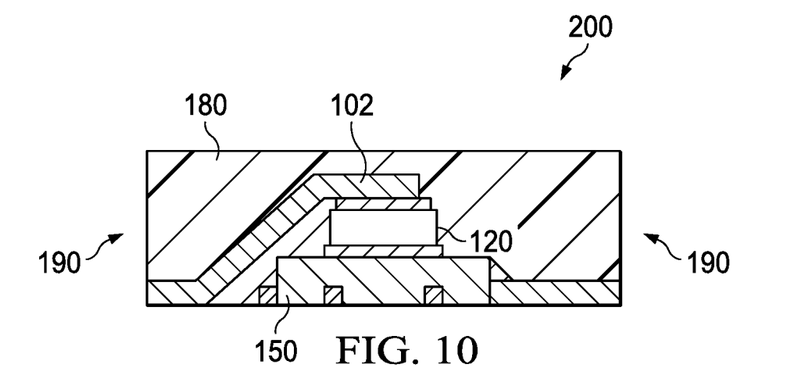

As shown in FIG. 10, the MOSFET package may be singulated, e.g., by cutting along edges 190, to thereby define a singulated power MOSFET package 200. Tape 176 may be peeled off or otherwise removed.

Figure 11:
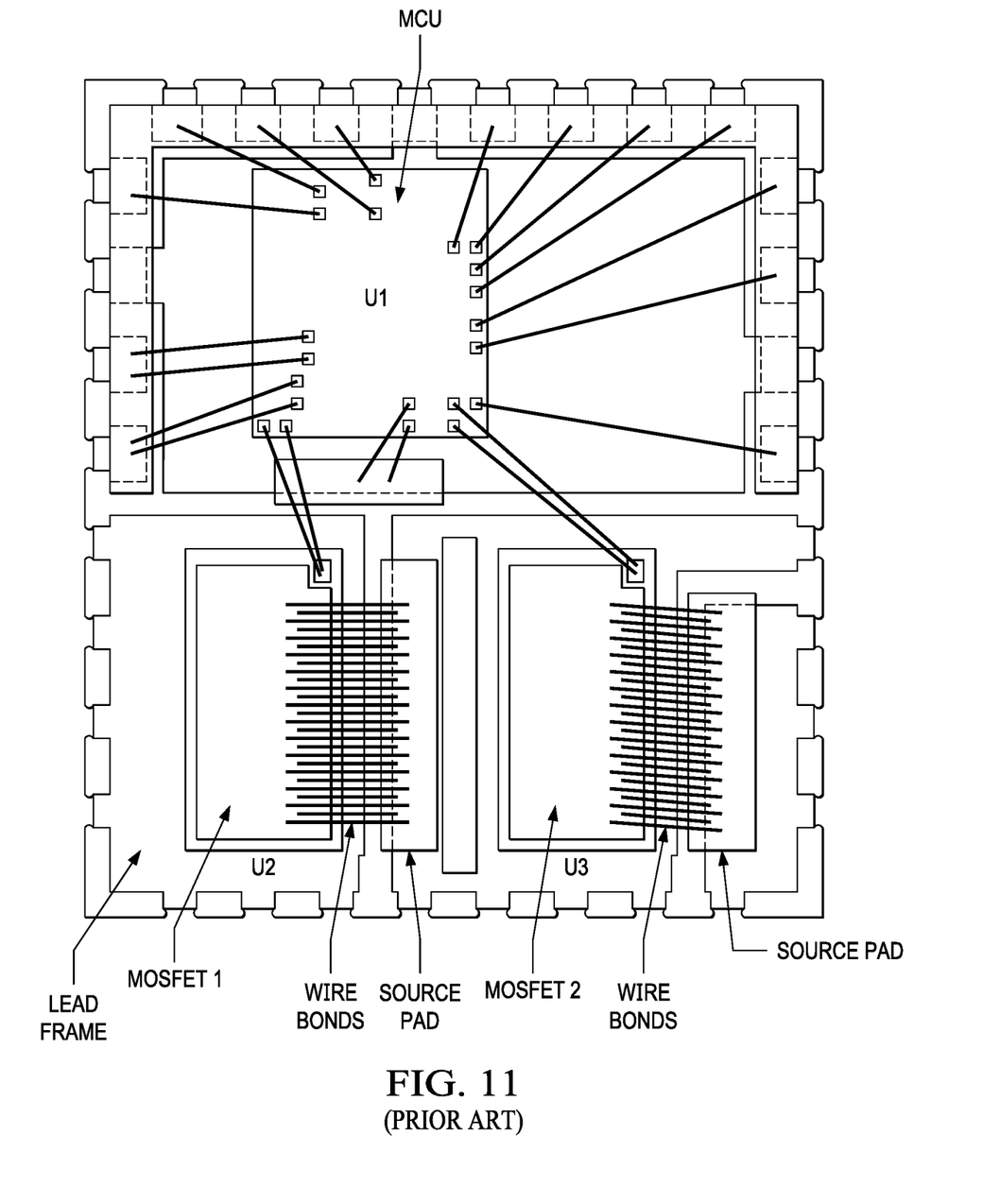
FIG. 11 shows a top view of an example conventional dual-MOSFET package assembly, prior to mold encapsulation.

FIG. 11 and FIGS. 12A-12B illustrate a conventional dual-MOSFET package assembly (FIG. 11) and a dual-MOSFET package assembly according to one example embodiment of the present invention (FIGS. 12A-12B).

FIG. 11 shows a top view of an example conventional dual-MOSFET package assembly, prior to mold encapsulation. The conventional design includes a lead frame, microcontroller (MCU) mounted on an MCU die-attach-pad of the lead frame, a first MOSFET, (e.g., high-side MOSFET) mounted on a first MOSFET die-attach-pad, and a second MOSFET (e.g., low-side MOSFET) mounted on a second MOSFET die-attach-pad. As show, Each MOSFET is coupled to a respective source pad by numerous wire bonds, for conducting high operational currents.

FIG. 12A shows a top view of an example lead frame 200 for a dual-MOSFET package according to one example embodiment of the present invention. Lead frame 200 may include two DAP tabs 202A and 202B bent or otherwise formed out of plane (e.g., upwards) with respect to a main lead frame structure 206, and connected to the main lead frame structure 206 via transition or coupling regions 210A and 210B, e.g., in a manner similar to the previously-discussed DAP tab 102 formed out of plane with main lead frame structure 106 (e.g., offset from main lead frame plane $P_{LF}$) and connected to the main lead frame structure 106 via transition region 110 (see FIGS. 2A and 2B for reference). Main lead frame structure 206 includes a plurality of leads, an MCU attach pad 254 configured to receive a microcontroller, and lead frame regions 206A-206C discussed below, which collectively define or lie in a main lead frame plane.

FIG. 12B shows a top view of the example lead frame 200 after solder attachment of a pair of MOSFET dies 220A, 220B and corresponding pair of conductive elements (e.g., metal slugs) 150A, 150B (and before mold encapsulation), e.g., according to techniques shown in FIGS. 3A-7B and discussed above. In particular, as shown in FIG. 12B, a source region 222A of a first MOSFET die 220A (e.g., high-side MOSFET) is solder attached to first DAP tab 202A, and a first conductive element (e.g., metal slug) 250A is solder attached to the back (drain) side of first MOSFET die 220A; and a source region 222B of a second MOSFET die 220B (e.g., low-side MOSFET) is solder attached to second DAP tab 202B, and a second conductive element (e.g., metal slug) 250B is solder attached to the back (drain) side of second MOSFET die 220B. In one embodiment, first and second MOSFET dies 220A and 220B may be simultaneously soldered to lead frame 200 (in particular, to DAP tabs 202A and 202B), and first and second conductive elements (e.g., metal slugs) 250A and 250B may be simultaneously soldered to MOSFET dies 220A and 220B. Referring to FIG. 12B, conductive element 250A may be soldered to a first drain-contact lead frame region 206A, and conductive element 250B may be soldered to a second drain-contact lead frame region 206B.

A microchip (MCU) 252 may be secured (e.g., by epoxy or solder attachment) to MCU attach pad 254 of lead frame 200. Selected elements of MCU 252 may be wire bonded to lead frame fingers or other structures of lead frame 20. In this example embodiment, gate contact regions 224A and 224B of MOSFETs 220A and 220B may be wire bonded to MCU 252. In another embodiment, lead frame 200 may include a pair of gate signal leads that may be bent or formed co-planar with DAP tabs 202A and 202B, e.g., similar to gate signal lead 104 shown in FIGS. 2A-2B and 3A-3B, and each gate contact region 224A and 224B of MOSFETs 220A and 220B may be solder attached to a respective gate signal lead.

As shown, each lead frame DAP tab 202A, 202B defines a source lead and each conductive element 250A, 250B defines a drain lead for the respective MOSFETs 202A, 202B. In this example device, the source lead (lead frame DAP tab 202A) of the first MOSFET 202A is conductively connected to the drain-lead (conductive element 250B) of the second MOSFET 202B via the transition/coupling region 210A and second drain-contact lead frame region 206B, which is solder-attached to the drain of second MOSFET 202B. Further, the source lead (lead frame DAP tab 202B) of the second MOSFET 202B is conductively connected to lead frame region 206C via the transition/coupling region 210B. These conductive connections via the respective lead frame structures may be suitable for conducting high operational currents with reduced resistance, e.g., as compared with the multiple wire bond connections between the source and source pads in the conventional design. In addition, the conductive elements (e.g., metal heat slugs) soldered to the drain side of the MOSFETs may increase the thermal dissipation capacity of the device, as compared with conventional designs.

Although the disclosed embodiments are described in detail in the present disclosure, it should be understood that various changes, substitutions and alterations can be made to the embodiments without departing from their spirit and scope.

What is claimed is:

1. An integrated circuit (IC) package, comprising:
   a lead frame including:
      a main lead frame structure including a plurality of leads lying in a main lead frame plane; and
      an offset lead frame die-attach pad (DAP) lying in an offset plane that is offset from the main lead frame plane;
   a semiconductor die having a first side attached to the offset lead frame DAP; and a metal heat slug attached to (a) a second side of the semiconductor die and (b) the main lead frame structure, wherein the semiconductor die is arranged between the offset lead frame DAP and the metal heat slug, such that the metal heat slug is spaced apart from the offset lead frame DAP; and wherein a thickness of the metal heat slug in a thickness direction perpendicular to the main lead frame plane is greater than (a) a thickness of the main lead frame structure in the thickness direction and greater than (b) a thickness of the DAP in the thickness direction.

2. The IC package of claim 1, wherein the metal heat slug is at least partially located in an area between the main lead frame plane and the offset plane.

3. The IC package of claim 1, wherein a surface of the metal heat slug is co-planar with the main lead frame structure.

4. The IC package of claim 1, wherein the thickness of the metal heat slug is greater than a thickness of the main lead frame structure in the thickness direction.

5. The IC package of claim 4, wherein the thickness of the metal heat slug is at least twice the thickness of the main lead frame structure in the thickness direction.

6. The IC package of claim 1, wherein:
the offset lead frame DAP defines a source lead for the semiconductor die; and
the metal heat slug defines a drain lead for the semiconductor die.

7. The IC package of claim 1, wherein the IC package comprises a power MOSFET package and the semiconductor die comprises a MOSFET die.

8. The IC package of claim 1, wherein the main lead frame structure further includes at least one additional die-attach-pad, lying in the main lead frame plane, for receiving at least one additional semiconductor die or device.

9. The IC package of claim 1, wherein:
the lead frame further includes a microcontroller die-attach-pad (DAP); and
the IC package includes a microcontroller mounted to the microcontroller DAP.

10. The IC package of claim 9, wherein the microcontroller DAP forms a portion of the main lead frame structure, lying in the main lead frame plane.

11. A method of forming an integrated circuit (IC) package, the method comprising:
providing a lead frame including a lead frame including:
a main lead frame structure including a plurality of leads, the main lead frame structure lying in a main lead frame plane; and
an offset lead frame die-attach pad (DAP) lying in an offset plane that is offset from the main lead frame plane;
attaching a first side of a semiconductor die to the offset lead frame DAP;
providing a metal heat slug physically distinct from the lead frame;
attaching the metal heat slug to a second side of the semiconductor die; and
attaching the metal heat slug to the main lead frame structure.

12. The method of claim 11, wherein the IC package comprises a power MOSFET package and the semiconductor die comprises a MOSFET die.

13. The method of claim 11, comprising attaching the metal heat slug to the second side of the semiconductor die and to the main lead frame structure in a common step.

14. The method of claim 11, comprising forming the lead frame by bending or otherwise reshaping the lead frame such that the offset lead frame DAP is located in the offset plane.

15. The method of claim 11, wherein after attaching the metal heat slug to the semiconductor die and main lead frame structure, the metal heat slug is at least partially located in an area between the main lead frame plane and the offset plane.

16. The method of claim 11, wherein after attaching the metal heat slug to the semiconductor die and main lead frame structure, a surface of the metal heat slug is co-planar with the main lead frame structure.

17. The method of claim 11, wherein the metal heat slug is at least twice as thick as the main lead frame structure, in a direction perpendicular to the main lead frame plane.

18. The method of claim 11, wherein:
the offset lead frame DAP defines a source lead for the semiconductor die; and
the metal heat slug defines a drain lead for the semiconductor die.

19. The method of claim 11, wherein:
the main lead frame structure further includes at least one additional die-attach-pad lying in the main lead frame plane; and
the method further includes mounting at least one additional semiconductor die or device on the at least one additional die-attach-pad.

20. A lead frame for an integrated circuit (IC) device, comprising:
a main lead frame structure including a plurality of leads, the main lead frame structure lying in a main lead frame plane;
an offset lead frame die-attach pad (DAP) configured for connection to a source contact region of a semiconductor die, the offset lead frame DAP lying in an offset plane that is offset from the main lead frame plane; and
an offset gate signal lead configured for connection to a gate contact region of the semiconductor die, the offset gate signal lead lying in the offset plane and spaced apart from the offset lead frame DAP.

* * * * *